United States Patent
Pratt et al.

(10) Patent No.: US 11,533,070 B2
(45) Date of Patent: Dec. 20, 2022

(54) SYSTEMS AND METHODS OF COMPENSATING FOR NARROWBAND DISTORTION IN POWER SEMICONDUCTOR DEVICES

(71) Applicant: Analog Devices International Unlimited Company, County Limerick (IE)

(72) Inventors: Patrick Joseph Pratt, Mallow (IE); Dong Chen, Beijing (CN); Mark Cope, Bath (GB); Christopher Mayer, Dover, MA (US); Praveen Chandrasekaran, Bengaluru (IN); Stephen Summerfield, Melrose, MA (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/099,107

(22) Filed: Nov. 16, 2020

(65) Prior Publication Data
US 2021/0194521 A1 Jun. 24, 2021

Related U.S. Application Data

(60) Provisional application No. 62/952,757, filed on Dec. 23, 2019.

(51) Int. Cl.
*H04B 1/04* (2006.01)
*H03F 1/32* (2006.01)
*H03F 3/21* (2006.01)

(52) U.S. Cl.
CPC ......... *H04B 1/0475* (2013.01); *H03F 1/3247* (2013.01); *H03F 3/21* (2013.01);
(Continued)

(58) Field of Classification Search
CPC .......... H04B 1/0475; H04B 2001/0425; H03F 1/324; H03F 3/21; H03F 2200/171;
(Continued)

(56) References Cited

U.S. PATENT DOCUMENTS 6,298,097 B1 10/2001 Shalom
6,828,858 B2 12/2004 Larson et al.
(Continued)

FOREIGN PATENT DOCUMENTS

EP 2311271 B1 9/2014
EP 2858321 B1 8/2018
(Continued)

OTHER PUBLICATIONS

Zhu, et al., "RF Power Amplifier Behavioral Modeling Using Volterra Expansion with Laguerre Functions", Department of Electronic and Elecrical Engineering, University College Dublin, Ireland.
(Continued)

*Primary Examiner* — Dac V Ha
(74) *Attorney, Agent, or Firm* — Knobbe, Martens, Olson & Bear, LLP

(57) ABSTRACT

Some embodiments herein describe a radio frequency power semiconductor device that include a first non-linear filter network for compensating for lower frequency noise of a power amplifier. The first non-linear filter network can include a plurality of infinite impulse response filters and corresponding corrective elements to correct for a non-linear portion of the power amplifier. The radio frequency power semiconductor device can further include a second non-linear filter network for compensating for broadband distortion. The second non-linear filter network can be connected in parallel to the first non-linear filter network. The broadband distortion can include digital predistortion and the
(Continued)

narrowband distortion can include charge trapping effects. The first non-linear filter network can comprise Laguerre filters. The second non-linear filter network can comprise general memory polynomial filters.

20 Claims, 12 Drawing Sheets

(52) U.S. Cl.
CPC .. *H03F 2200/171* (2013.01); *H03F 2200/451* (2013.01); *H04B 2001/0425* (2013.01)

(58) Field of Classification Search
CPC ....... H03F 2200/451; H03F 2201/3224; H03F 1/3258; H03F 3/213; H03F 3/195
See application file for complete search history.

(56) References Cited

U.S. PATENT DOCUMENTS

| | | |
|---|---|---|
| 7,149,257 B2 | 12/2006 | Braithwaite |
| 7,330,517 B2 | 2/2008 | Taler et al. |
| 7,542,518 B2 | 6/2009 | Kim et al. |
| 7,577,211 B2 | 8/2009 | Braithwaite |
| 7,773,692 B2 | 8/2010 | Copeland et al. |
| 7,848,451 B2 | 12/2010 | Cai et al. |
| 8,023,587 B2 | 9/2011 | Deng et al. |
| 8,798,559 B2 | 8/2014 | Kilambi et al. |
| 9,306,506 B1 | 4/2016 | Zhang et al. |
| 9,338,039 B1 | 5/2016 | Barnes |
| 9,356,592 B2 | 5/2016 | Hwang et al. |
| 9,369,121 B2 | 6/2016 | Jeon et al. |
| 9,374,044 B2 | 6/2016 | Jian et al. |
| 9,705,477 B2 | 7/2017 | Velazquez |
| 9,735,741 B2 | 8/2017 | Pratt et al. |
| 9,787,459 B2 | 10/2017 | Azadet |
| 9,866,269 B1 | 1/2018 | Zhao et al. |
| 10,324,169 B2 | 6/2019 | Tua |
| 10,447,211 B2 | 10/2019 | Rollins et al. |
| 10,498,372 B2 | 12/2019 | Pratt |
| 10,715,702 B1 | 7/2020 | Zhao et al. |
| 11,108,364 B1 | 8/2021 | Barnes |
| 2002/0178133 A1* | 11/2002 | Zhao .................... G05B 13/048 706/21 |
| 2005/0157814 A1 | 7/2005 | Cova et al. |
| 2008/0129379 A1 | 6/2008 | Copeland |
| 2008/0130787 A1 | 6/2008 | Copeland |
| 2011/0204975 A1 | 8/2011 | Miyashita |
| 2011/0255628 A1* | 10/2011 | Woleben .............. H04B 1/0475 375/285 |
| 2012/0176190 A1 | 7/2012 | Goodman et al. |
| 2012/0286985 A1 | 11/2012 | Chandrasekaran et al. |
| 2013/0200948 A1* | 8/2013 | Lee .................... H04B 1/0475 330/10 |
| 2013/0329832 A1* | 12/2013 | Morita .................... H03F 3/24 375/296 |
| 2014/0269988 A1 | 9/2014 | Schafferer et al. |
| 2016/0190993 A1 | 6/2016 | Nobbe et al. |
| 2018/0331662 A1 | 11/2018 | Maa et al. |
| 2019/0356345 A1* | 11/2019 | Ota ..................... H04B 1/0475 |
| 2020/0244232 A1* | 7/2020 | Cope ...................... H03F 3/19 |
| 2020/0259465 A1 | 8/2020 | Wu et al. |
| 2020/0389194 A1 | 12/2020 | Luo et al. |
| 2021/0067097 A1 | 3/2021 | Wang et al. |
| 2021/0194521 A1 | 6/2021 | Pratt |
| 2021/0384891 A1 | 12/2021 | Enzinger |
| 2022/0131506 A1 | 4/2022 | Venkitasubramani et al. |

FOREIGN PATENT DOCUMENTS

| | | |
|---|---|---|
| EP | 3166223 B1 | 9/2020 |
| EP | 3843267 | 6/2021 |
| KR | 10-2018-0088882 | 8/2018 |

OTHER PUBLICATIONS

Amin, et al., "Digital Predistortion of Single and Concurrent Dual-Band Radio Frequency GaN Amplifiers With Strong Nonlinear Memory Effects", IEEE Transactions of Microwave Theory and Techniques, vol. 65, No. 7, Jul. 2017.
Extended European Search Report dated May 10, 2021 for European Patent Application No. 20212838.5. 11 pages.
Barradas, et al., "Compensation of Long-Term Memory Effects on GaN HEMT-Based Power Amplifiers", Mar. 2017.
Ghannouchi, et al., "Distortion and impairments Mitigation and Compensation of Single- and Multi-Band Wireless Transmitters", May 1, 2013.
Sohib, et al., "Digital Predistortion of Single and Concurrent Dual-Band Radio Frequency GaN Amplifiers With Strong Nonlinear Memory Effects", Jul. 2017.
"ADRV9026 Quad-Channel, Wideband RF Transceiver Platform: 200 MHz Bandwidth Integrated Radio Transceiver Solution". Analog Devices, Inc. www.analog.com, 2019 in 4 pages.
Binari et al., "Trapping Effects in GaN and SiC Microwave FETs". Proceedings of the IEEE, vol. 90, No. 6. (2002), pp. 1048-1058.
Bisi, "Characterization of Charge Trapping Phenomena in GaN-based HEMTs". Universitá Degli Studi Di Padova, Information Science and Technology. Jan. 28, 2015 in 119 pages.
Chen et al., "The Trap Locations of GaN HEMT by Current Transient Spectroscopy". Global Communication Semiconductors, LLC (GCS). 2017 in 4 pages.
Joh et al., "A Current-Transient Methodology for Trap Analysis for GaN High Election Mobility Transistors". IEEE Transactions On Electron Devices, vol. 58, No. 1. (2010), pp. 132-140.
Medrel et al., "A 10W S-band class-B GaN amplifier with a dynamic gate bias circuit for linearity enhancement", International Journal of Microwave and Wireless Technologies, vol. 6, No. 1, Feb. 2014, pp. 3-11.
Uren et al., "Buffer design to minimize current collapse in GaN/AlGaN HFETs". IEEE Transactions on Electron Devices, vol. 59, No. 12. (2012), pp. 3327-3333.
Yuk et al., "An improved empirical large-signal model for high-power GaN HEMTs including self-heating and charge-trapping effects". IEEE MTT-S International Microwave Symposium Digest, https://ieeexplore.ieee.org/abstract/document/5165806, 2009 in 2 pages.
Jardel et al. "An Electro thermal Model for AIGaN/GaN Power HEMTs Including Trapping Effects to Improve Large-Signal Simulation Results on High VSWR", IEEE transactions on Microwave theory and Techniques vol. 55, No. 12, Dec. 2007, pp. 2660-2669. (Year: 2007).
Gomes et al., "An Accurate Characterization of Capture Time Constants in GaN HEMTs", IEEE transactions on Microwave theory and Techniques vol. 67, No. 7, Jul. 2019, pp. 2465-2474 (Year: 2019).
Barradas et al. "Compensation of long-term memory effects on GaN HE MT-based power amplifiers", IEEE Trans. Microwave Theory Techniques, vol. 65, No. 9, pp. 3379-3388, Sep. 2017 (Year: 2017).
Tome'et al., "A Multiple-Time-Scale Analog Circuit for the Compensation of Long-Term Memory Effects in GaN H EMT-Based Power Amplifiers", IEEE Transactions On Microwave Theory and Techniques, vol. 68 Issue: 9, Sep. 2020, pp. 3709-3723. (Year: 2020).
Sohib, et al., "Digital Predistortion of Single and Concurrent Dual-Band Radio Frequency GaN Amplifiers With Strong Nonlinear Memory Effects" Jul. 2017, in 12 pages.
Extended European Search Report for EP Application No. 21202951.6, dated Mar. 23, 2022, in 11 pages.

* cited by examiner

SYSTEMS AND METHODS OF COMPENSATING FOR NARROWBAND DISTORTION IN POWER SEMICONDUCTOR DEVICES

BACKGROUND

Field of the Invention

The disclosed technology relates generally to semiconductor devices, and more particularly to power semiconductor devices in which narrowband distortion effects are compensated.

Description of the Related Technology

Radio transceivers can be used in a wide variety of radio frequency (RF) communication systems. For example, transceivers can be included in base stations or mobile devices to transmit and receive signals associated with a wide variety of communications standards, including, for example, cellular and/or wireless local area network (WLAN) standards. Transceivers can also be used in radar systems, instrumentation, industrial electronics, military electronics, laptop computers, digital radios, and/or other electronics.

RF communication systems can also include power amplifiers for amplifying RF transmit signals from transceivers to power levels suitable for wireless transmission. Various types of power amplifiers exist, including power amplifiers utilizing silicon (Si)-based devices, gallium arsenide (GaAs)-based devices, indium phosphide (InP)-based devices, silicon carbide (SiC)-based devices, and gallium nitride (GaN)-based devices. Various types of power amplifiers can offer different advantages in terms of cost, performance, and/or frequency of operation. For example, while Si-based power amplifiers generally provide lower fabrication cost, some Si-based power amplifiers are inferior compared to their compound semiconductor counterparts in terms of certain performance metrics.

SUMMARY

Some embodiments include a radio frequency (RF) power semiconductor device, wherein the device comprises: a first non-linear filter network configured to compensate for narrowband distortion of a power amplifier, wherein the first non-linear filter network comprises a corrective element configured to correct for a non-linear portion of the power amplifier; and a second non-linear filter network configured to compensate for broadband distortion of the power amplifier.

In some embodiments, the first non-linear filter network comprises a first plurality of infinite impulse response (IIR) filters arranged in series.

In some embodiments, a first filter of the first plurality of IIR filters comprises a low pass filter (LPF).

In some embodiments, a second filter of the first plurality of IIR filters comprises an all-pass filter.

In some embodiments, the first plurality of IIR filters are orthogonal to each other.

In some embodiments, the first non-linear filter network comprises a plurality of IIR filters 1 to N arranged in series, wherein the plurality of IIR filters 1 to N are arranged in parallel.

In some embodiments, the device further comprises 1 to N corrective elements corresponding to the plurality of IIR filters 1 to N, wherein the 1 to N corrective elements correct for the non-linear portion of the power amplifier before the corrected signal propagates through the corresponding plurality of IIR filters.

In some embodiments, correcting for the non-linear portion of the power amplifier comprises, for each of the 1 to N corrective elements, applying an exponential to the amplitude of the signal.

In some embodiments, the device further comprises: the power amplifier, wherein the power amplifier comprises a compound semiconductor power amplifier, and the narrowband distortion is caused by charge trapping effects as the compound semiconductor power amplifier is charged from low to high power.

In some embodiments, the compound semiconductor power amplifier comprises a Gallium Nitride (GaN) power amplifier.

In some embodiments, the device further comprises: a down sampler to down sample an input signal and transmit the down sampled signal to the first non-linear filter network; and an up sampler to up sample the output of the first non-linear filter network.

In some embodiments, the device further comprises: a mixer to mix the output of the first non-linear filter network with the input of the first non-linear filter network; and a first buffer configured to delay the input of the first non-linear filter network to match the timing of the signal with the output of the first non-linear filter network.

In some embodiments, the device further comprises: a second buffer configured to delay the output of the mixer with the output to match the timing with the output of the FIR filters.

In some embodiments, the second non-linear filter network comprises a plurality of finite infinite response (FIR) filters.

In some embodiments, the first non-linear filter network comprises a Laguerre filter.

Some embodiments include a radio frequency (RF) power semiconductor device, wherein the device comprises: a first non-linear filter network configured to compensate for narrowband distortion of a power amplifier, wherein the first non-linear filter network comprises a plurality of infinite impulse response (IIR) filters and corresponding corrective elements configured to correct for a non-linear portion of the power amplifier.

In some embodiments, the plurality of IIR filters comprise Laguerre filters.

In some embodiments, the device further comprises: a crest factor reduction function; and a second non-linear filter network configured to compensate for broadband distortion of the power amplifier, wherein the crest factor reduction function is connected in series with the second non-linear filter network.

In some embodiments, the second non-linear filter network comprises a plurality of finite infinite response (FIR) filters.

Some embodiments include a method of digital predistortion (DPD) comprising: amplifying a transmit signal using a power amplifier; compensating for narrowband distortion of the power amplifier by pre-distorting the transmit signal using a first non-linear filter network, including correcting for a non-linear portion of the power amplifier using a corrective element of the first non-linear filter; and compensating for broadband distortion of the power amplifier by pre-distorting the transmit signal using a second non-linear filter network.

DETAILED DESCRIPTION

Charge Trapping and Digital Predistortion

Figure 1A:
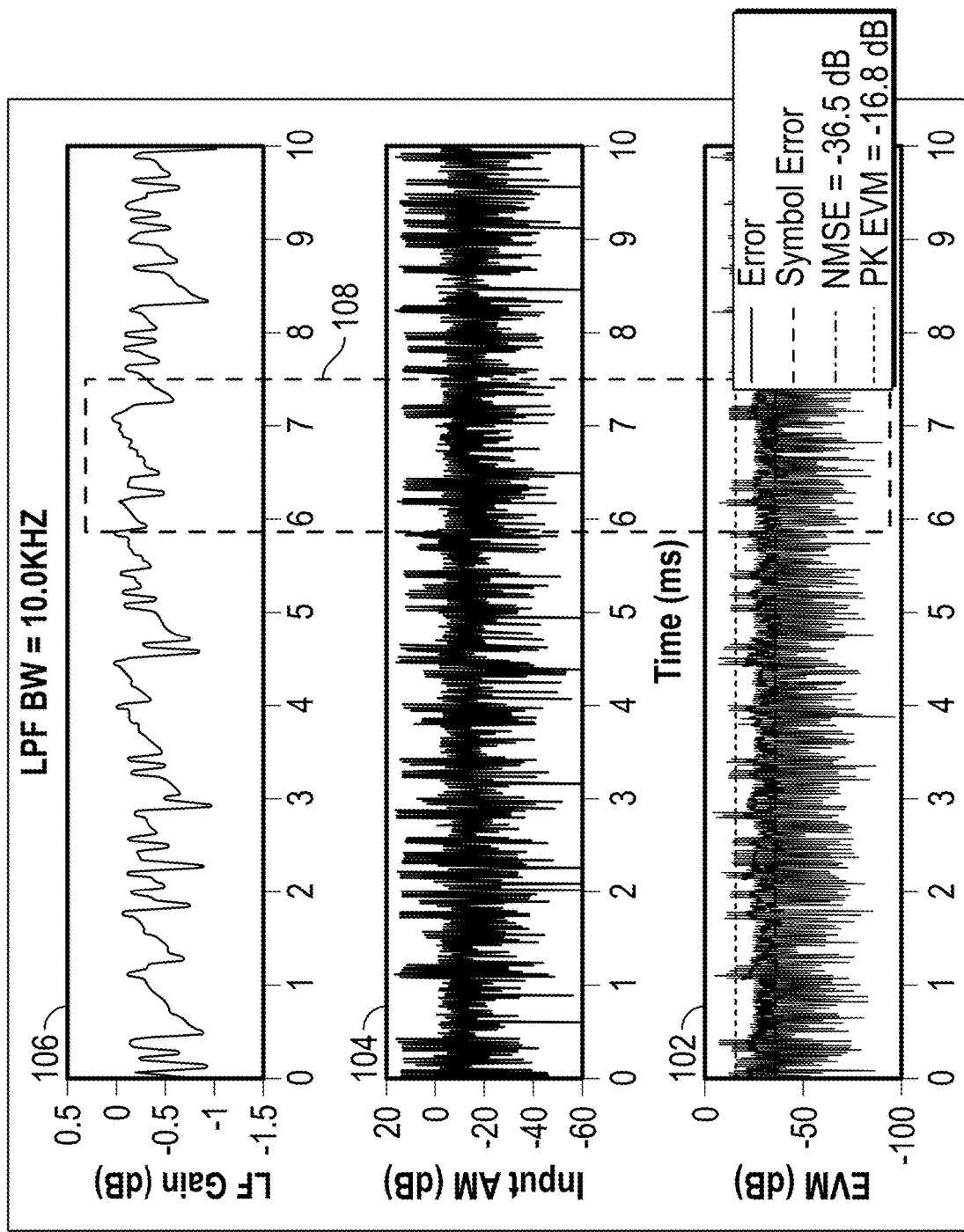
FIG. 1A depicts one example of graphs of low frequency (LF) gain versus time, input amplitude modulation versus time, and error vector magnitude (EVM) versus time without charge trapping digital pre-distortion (DPD).

Power devices such as radio frequency (RF) power devices are used in many applications, e.g., wireless technologies. For various applications, power devices are based on silicon technology, e.g., Si-based laterally diffused metal oxide semiconductor (LDMOS) devices. For some applications, compound semiconductors, such as III-V materials, have advantages for high frequency operation. For example, gallium nitride (GaN)-based power devices, e.g., DC/LF and RF power devices, have been proposed. Compound semiconductor power devices, such as GaN-based power devices, have been predicted to have advantages over Si-based technologies in some applications, e.g., in process architectures where drain modulation is applied. The expected advantages include improvements in efficiency and frequency range (e.g., higher unity gain cutoff frequency or fT), among other advantages.

GaN has widely been used in various applications, including light emitting diode (LED) devices. While the interest in GaN RF power devices for various other commercial applications has been steadily rising, the implementation of GaN-based power devices including RF power devices has been largely limited to low volume applications such as military/aerospace. The limited implementation has been due in part due to fabrication costs, which are currently significantly higher than Si-based technologies. There are currently two main types of GaN RF power devices, including GaN-on-insulator technology and GaN-on-Si technology. While the former has higher performance, wafer fabrication costs are also higher.

In addition to cost considerations, certain technological improvements are sought after in GaN-based power devices. One such improvement is associated with addressing relatively narrowband distortion effects that have been observed in GaN-based power devices. Without being limited to any particular theory, it is believed that charge-trapping effects result in significant variation in the device characteristics, including variations in gain linearity of the GaN-based power devices. The charge-trapping is believed to be a function of the long-term history of the input signal, whose effects can last on the order of milliseconds to seconds. A term that has been used to express this effect is "current collapse," which is used to describe an effect whereby the drain current collapses to a level less than expected upon applying a high-power RF pulse to the GaN transistor.

Effects of charge trapping include, but are not limited to, transconductance frequency dispersion, current collapse of the direct current drain characteristics, gate-lag transients, drain-lag transients, and/or restricted microwave power output.

Accordingly, as the power is being modulated, charges can get trapped and then released at a low frequency, which results in a low frequency modulation of the gain which causes distortion. Thus, there is a need to mitigate or compensate for the charge-trapping effects in GaN-based power devices as well as other types of power devices.

Figure 1B:
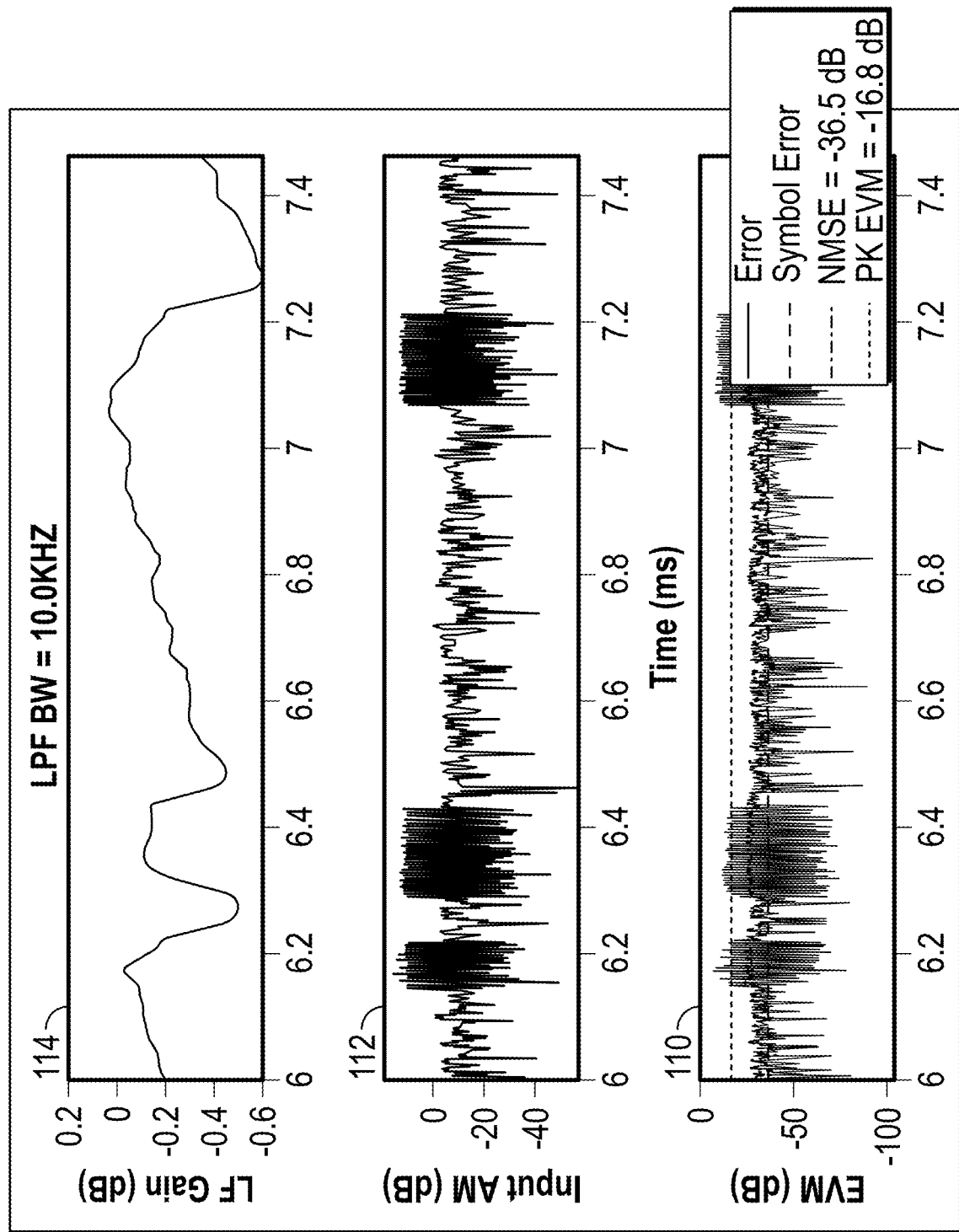
FIG. 1B depicts an expanded portion of the graphs of FIG. 1A.
Figure 1C:
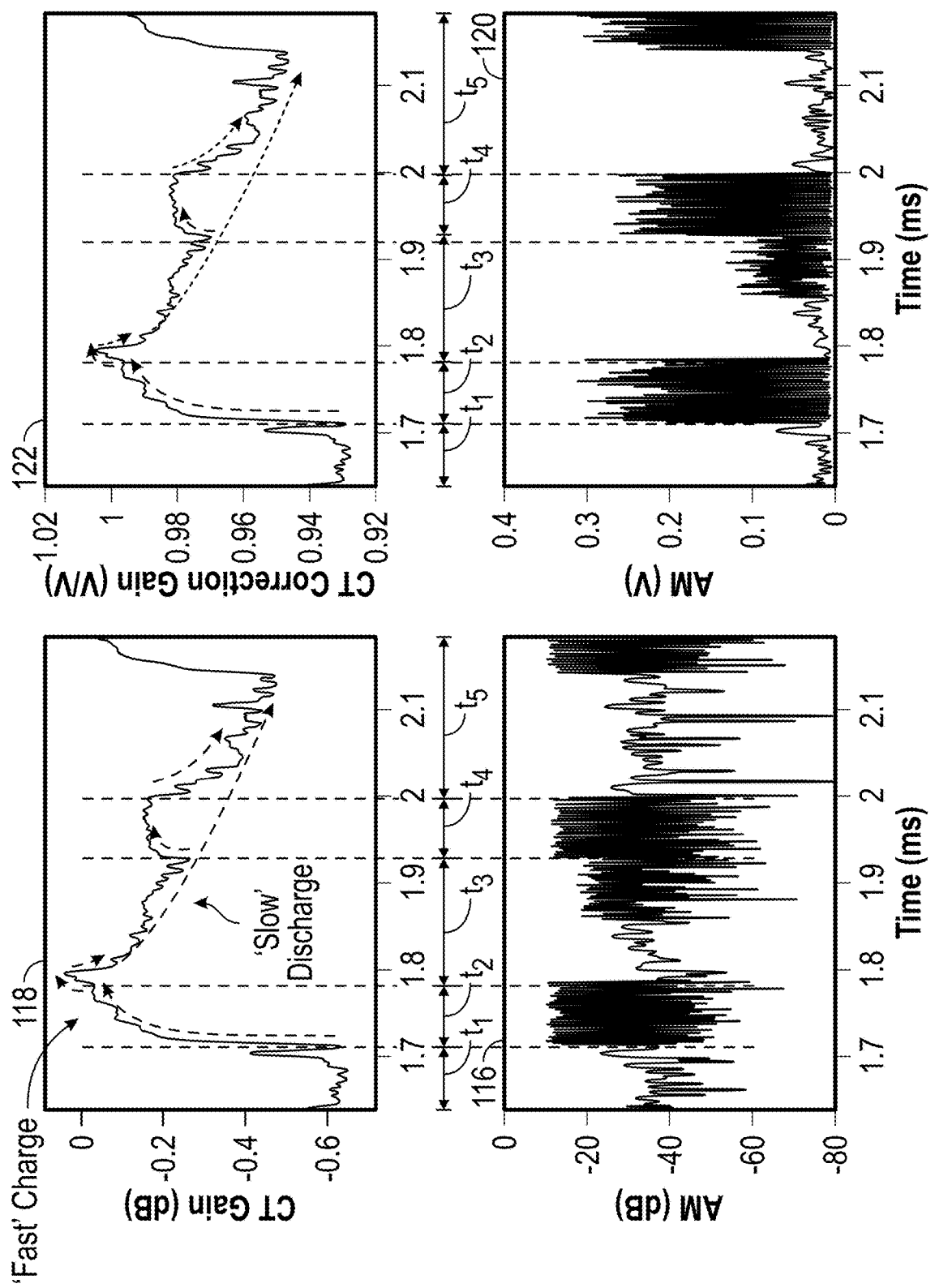
FIG. 1C depicts one example of graphs of charge trapping gain versus time, charge trapping correction versus time, input amplitude modulation (in decibels) versus time, and input amplitude modulation (in volts) versus time for charge trapping DPD in accordance with one embodiment.

FIGS. 1A, 1B, and 1C include graphs 102, 104, 106, 110, 112, and 114, 116, and 118 that illustrate the low frequency modulation of the gain, according to some embodiments. Graph 102 illustrates the Error Vector Magnitude (EVM) over time. Graph 104 illustrates the input Amplitude-Modulated (AM) signal in dB over time. The input amplitude-modulated signal is applied to a GaN amplifier, which produces a low frequency gain modulation. Graph 106 illustrates the Low Frequency (LF) gain in dB over time where the gain is measured across a 0 Hz to 10 kHz BW. Graphs 110, 112, and 114 of FIG. 1B are close-up snippets 108 of the graphs 102, 104, and 106 of FIG. 1A, respectively.

As shown in graph 104, a pulsing occurs in the input amplitude modulated signal. Graph 112 illustrates low signals, such as between 6.5-7 milliseconds, and a high signal, such as between 7.1-7.2 milliseconds. However, the signals are pulsing when both in the high and low signal state. Graph 106 illustrates the corresponding low frequency gain for the input amplitude modulated signal of graph 112. As illustrated, the low frequency gains are showing a modulation effect.

Graphs 116, 118, 120, and 122 illustrate the charge trapping effect and the slow relaxation effect in more detail. Graph 116 illustrates the input amplitude-modulated signal in dB over time, and graph 120 illustrates the input amplitude-modulated signal in voltage over time. Graph 114 illustrates the charge trap gain in dB over time, and graph 122 illustrates the charge trap correction gain over time. When going from low to high power, such as from the transition between $t_1$ to $t_2$, the increased input results in charges moving from one layer to another inside the power amplifier. When the power goes from low to high, some of the charges get trapped. The trapping effect is relatively fast. This is the charge trapping effect. When the input transitions from high to low power, such as the transition between $t_2$ to $t_3$, the charges are released, but the charges are released back with slower time constants. Those time constants can be in the order of hundreds of microseconds. All of the charge trapping and discharging generate a low frequency gain modulation, which is a distortion effect in the power amplifier.

Power amplifiers are nonlinear devices whose gain can expand and compress as a function of the current and past input amplitude. In laterally-diffused metal-oxide-semiconductor (LDMOS) devices this gain modulation can encompasses past amplitude values extending back ~10 ns to ~100 ns, while GaN devices the nonlinear memory can extend back us, ms, or even seconds. In some embodiments, the sampling frequency can be between 10-500 MHz. In some embodiments, the actuators of these systems can be trained over a window of time between 1 nanosecond to 100 nanoseconds, 8 nanoseconds to 800 nanoseconds, 16 nanoseconds to 1600 nanoseconds, 32 nanoseconds to 3200 nanoseconds, 64 nanoseconds to 6400 nanoseconds, and/or the like.

The issue with such an approach as applied to low frequency charge trapping is that when these typical systems determine correction for digital predistortion (DPD), the systems can use a solver, such as a least squares solver. These least squares solvers use linear algebra in the finite input pulse (FIR) filters. Truncated Volterra series down to a generalized memory polynomial can be used for the FIR filters.

For charge trapping effects at low frequencies, the time constants can be 100 or 1,000 times longer. As an example, if on a power amplifier, the charge trapping effect extends 10 milliseconds in time, these typical systems would have to store data that extend at least over 10 milliseconds. The vectors and matrices used for high frequency DPD distortion may require 300 to 400 columns in the matrices. However, for the low frequency charge trapping effects, the FIR filter computations would now have thousands or tens of thousands of entries. Typical FIR filters use moving averages of weighted inputs and to increase the order of magnitude of the taps in the FIR filters, which make such processing very complex.

Such computation may result in numerical instability in simulations, delays in latency to the antenna element, and increased circuit footprint and power consumption. Moreover, linear algebra can be used to train and adapt the DPD, and a large dimension system of equations would be costly and numerically unstable. Furthermore, if we build the DPD actuator with FIRs that extend back in memory 100,000s of samples, the DPD actuator would simply be too costly and require a lot of power.

To be able to use typical systems to correct for charge trapping effects, the FIR filters would have to filter through time constraints over thousands of samples. This would involve an exorbitant amount of hardware storing each iteration of the FIR filters, and involve a lot of power consumption. These typical systems are not practical for transceivers and antenna processing chips, where processing power and circuitry footprints are limited. Moreover, computers may not have the processing power to even prove such a concept in a simulator. From a numerical computation point of view, the computations required in the FIR filters would become too complicated and large.

Furthermore, another deficiency of such an approach are the non-linear terms at the input of the FIR filters to model the non-linear nature of DPD. These typical systems may now have thousands of taps, where the system may transmit an absolute value of a signal to a first tap, the squared of the absolute value of the signal to a second tap, a cubed of the absolute value of the signal to a third tap, and so forth, resulting again in the deficiencies described herein, such as increased circuit footprint and power consumption.

Non-Linear Filter Networks to Correct Narrow and Broad Band Frequency Distortion Described herein are systems and methods that solve or mitigate the problem of charge-trapping effects. Some embodiments include a radio frequency (RF) power semiconductor device configured to correct for charge trapping effects. In some embodiments, the RF semiconductor device can correct for both charge trapping effects and broadband distortion of the power amplifier.

Figure 2A:
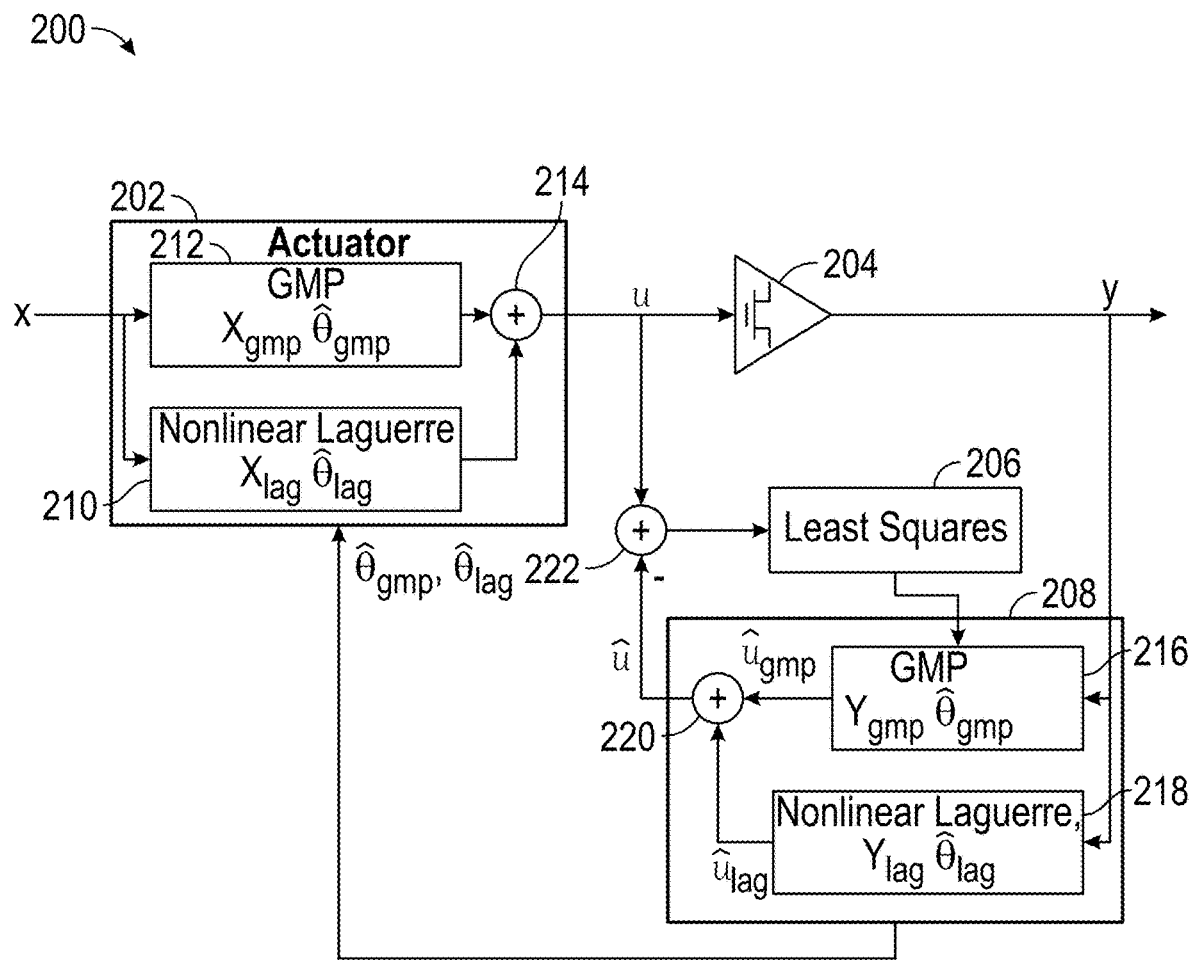
FIG. 2A illustrates an RF semiconductor device including a first non-linear filter network to correct narrowband distortion and a second non-linear filter network to correct broadband distortion, according to some embodiments.

FIG. 2A illustrates an RF semiconductor device 200 including a first non-linear filter network to correct narrow band distortion and a second non-linear filter network to correct broad band distortion, according to some embodiments. The device can include an actuator 202, a power amplifier 204 (including a FET, such as a GaN FET, in this example), a least squares module 206, and a feedback actuator 208.

As shown in FIG. 2A, the actuator 202 can include a first non-linear filter network 210 configured to compensate for narrowband distortion of a power amplifier, such as frequencies from 10 kHz to 0.1 Hz. The first non-linear filter network 210 can comprise a plurality of non-linear filters, such as infinite impulse response (IIR) filters. The IIR filters can collectively function as a Laguerre filter, in this embodiment. The first non-linear filter network 210 can comprise a cascade or a chain of IIR filters. In some embodiments, the first filter is a low pass filter, and the following filters in the chain of IIR filters are all pass filters. In some embodiments, the filters of the first non-linear filter network 210 are orthogonal to each other. The use of IIR filters enables the system to use long time constants to account for the narrowband charge trap effect. Laguerre filters have not been known to be used for correcting narrowband charge trapping effects.

In some embodiments, the second non-linear filter network 212 can be configured to compensate for broadband distortion of the power amplifier. The second non-linear filter network 212 can comprise a plurality of non-linear filters, such as finite impulse response (FIR) filters. The FIR filters can collectively function as a general memory polynomial (GMP) filter. In some embodiments, the second non-linear filter network 212 can include digital predistortion (DPD) systems and/or DPD filter networks that compensate for broadband distortion.

In some embodiments, the input signal x is fed into the first non-linear filter network 210 to generate a signal to compensate for the narrowband distortion. The same input signal can be fed into the second non-linear filter network 212 to compensate for the broadband distortion. A combination of the output of the first non-linear filter network 210 and the second non-linear filter network 212 is added by the adder 214. The output of the adder 214 is fed into the power amplifier 204. In some embodiments, the input signal x corresponds to a stream of digital data (such as in-phase (I) and quadrature-phase (Q) data) provided by a baseband processor.

Although shown as being directly provided to the power amplifier 204, the output of the adder 214 can correspond to digital pre-distorted transmit data that is processed by one or more, digital-to-analog converters (DACs), one or more mixers, one or more variable gain amplifiers (VGAs), and/or other circuitry to generate an RF transmit signal provided to an input of the power amplifier 204.

In some embodiments, the output and the input to the power amplifier 204 is also used to fit an inverse model, such as the feedback actuator 208. The output of the power amplifier 204 can be fed into another first non-linear filter network 218 and another second non-linear filter network 216. In some embodiments, the input power and/or output power of the power amplifier 204 is captured by a directional coupler, and then processed by an observation receiver to generate a digital representation of the observed power.

With continuing reference to FIG. 2A, the output of the other first non-linear filter network 218 and other second non-linear filter network 216 are added by the adder 220. Then, the input of the power amplifier 204 is subtracted by the output of the adder 220 via another adder 222. The output of the other adder 222 is processed through a least squares module 206. The output of the least squares module 206 is used by the other second non-linear filter network 216.

In some embodiments, the feedback actuator can comprise a first non-linear filter network, such as a Laguerre filter, and a second non-linear filter network, such as a GMP filter.

In some embodiments, the first non-linear filter network is arranged in parallel with the second non-linear filter network. In other embodiments, the first non-linear filter network is arranged in series with the second non-linear filter network. The first non-linear filter network is arranged after the second non-linear filter network, where the second non-linear filter network accommodates for the high frequency distortion, and the first non-linear filter network accommodates for the low frequency charge trapping distortion.

The power amplifier 204 amplifies an RF signal having a carrier frequency. Additionally, the narrowband distortion corrected by the first non-linear filter network 210 (for instance, a Laguerre filter) can correspond to distortion surrounding a limited bandwidth around the carrier frequency and occurring over long timescales associated with the charge trapping dynamics. For example, a bandwidth BW around the carrier frequency can be inversely proportional to a time constant $\tau$ (BW $\propto$ 1/$\tau$), and thus charge trapping effects are associated with long time constants and narrow bandwidth. Such narrowband distortion is also referred to herein as low frequency noise of a power amplifier.

The broadband distortion corrected by the second non-linear filter network 212 (for instance, a GMP filter) can include non-linearity in the power amplifier (non-charge trap nonlinearities) occurring over much shorter time scales than the narrowband distortion. Thus, the time constant associated with such non-linearity is small and the corresponding bandwidth is wide. Such broadband distortion is also referred to herein as high frequency noise of a power amplifier.

Example Architecture of First Non-Linear Filter Network

Figure 2B:
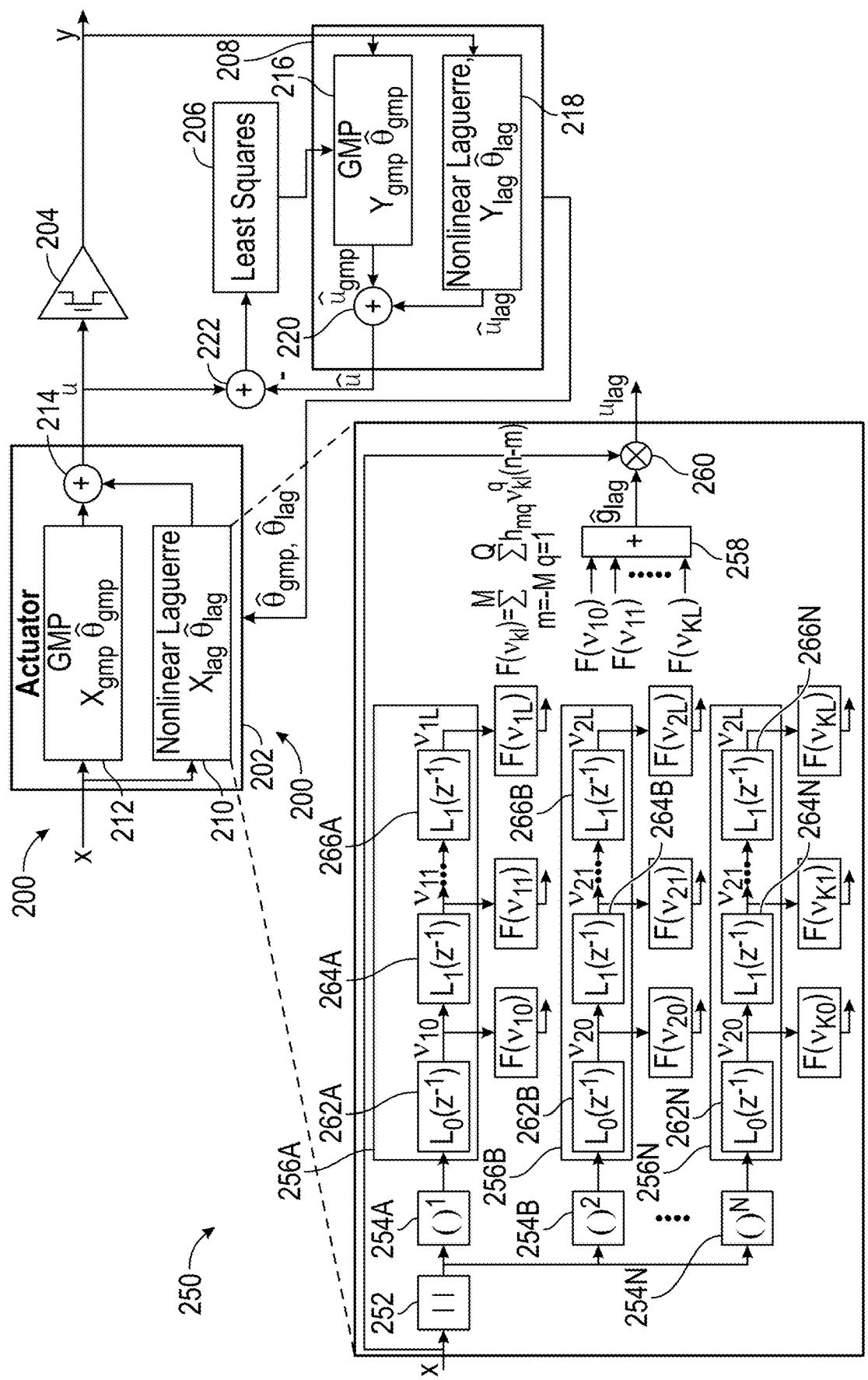
FIG. 2B illustrates an example architecture of a first non-linear filter network, according to some embodiments.

FIG. 2B illustrates an example architecture of a first non-linear filter network, according to some embodiments.

In some embodiments, the first non-linear filter network 210 can include an absolute value block 252, corrective elements 254A, 254B, 254N, a plurality of stages (1 to N) 256A, 256B, 256N, an adder 258, and a multiplier 260. Each stage 256A, 256B, 256N can include a plurality (1 to M) of non-linear filters. Each (or at least some) of the 1 to M of filters can include a first non-linear low pass filter (LPF) 262A, 262B, 262N, and possibly one or more non-linear all pass filter 264A, 264B, 264N, 266A, 266B, 266N. For each stage 256A, 256B, 256N, the LPF and possibly one or more all pass filter can be arranged in series. The LPF filter can receive a signal, process the signal through the LPF, output the signal to a series of all-pass filters, and process the signal through the all-pass filters. In some embodiments, the filters of the first non-linear filter network are orthogonal to each other. For example, the LPF can allow signals with frequencies lower than a certain cutoff frequency to pass through the LPF, and the subsequent all-pass filters can allow signals to pass with only a phase modification and no or minimal effect on the magnitude. The nonlinear functions $F(v_{kl})$ in FIGS. 2b and 3 can include a memory polynomial expansion of $v_{kl}$, for example $F(v_{kl}) = \Sigma f_{m,q}^{M,Q} f_{mq} v_{kl}^q(n-m)$.

In some embodiments, the stages 256A, 256B, 256N (e.g., the 1 to M filters, each stage can include a LPF and possibly one or more all-pass filters) are arranged in parallel to each other. In some embodiments, each of the 1 to M of filters include a corrective element, described in further detail herein. Each of the stages 256A, 256B, 256N can account for a different time constant, as the charge trap distortion can occur in multiple responses across various time scales.

In some embodiments, a complex baseband signal is received from the digital upconverter (x), which can include an in-phase and quadrature-phase (I/Q) signal. The device generates an envelope of the signal by determining an absolute signal of the complex baseband signal via the absolute value block 252. For example, a coordinate rotation digital computation (CORDIC) circuit can be used for processing digital I and digital Q data to generate a digital envelope. The absolute value block 252 outputs the envelope of the signal.

In some embodiments, the device propagates the output of the absolute value block 252 to a plurality of corrective elements 254A, 254B, 254N. The plurality of corrective elements 254A, 254B, 254N introduce non-linearity to the signal. For example, the plurality of corrective elements (e.g., 1 to N corrective elements) 254A, 254B, 254N can take exponentials of the outputs of the absolute value block 252. The first corrective element 254A can take a 1 exponential of the output of the absolute value block 252. The second corrective element 254B can take a 2 exponential of the output of the absolute value block 252. The N corrective element 254N can take an N exponential of the output of the absolute value block 252. For example, FIG. 2B illustrates that the output of the absolute value block 252 (e.g., | |) is sent to three corrective elements 254A, 254B, 254N. The first corrective element 254A takes a 1 exponential (( )$^1$), which is essentially the same as the output of the absolute value block 252. The output is sent to a first plurality of non-linear Laguerre filters 256A. The second corrective element 254B takes a 2 exponential (( )$^2$), and sends the output to a second plurality of non-linear Laguerre filters 256B. The third corrective element 254N can takes the $n^{th}$ exponential (( )$^n$), and sends the output to a third plurality of non-linear Laguerre filters 256N. Thus, the corrective elements 254A, 254B, 254N take non-linear powers of the envelope.

In some embodiments, the outputs of the 1 to N corrective elements 254A, 254B, 254N are propagated to corresponding 1 to N plurality of non-linear filters 256A, 256B, 256N, such as 1 to N Laguerre filters. The first filters 262A, 262B, 262N can include low pass filters, and the remaining filters 264A, 264B, 264N, 266A, 266B, 266N can include all-pass filters. The following are numerical representations of the Low Pass Filter (LPF) and the all-pass Filters (BPF).

$$\text{Stage 0: } LPF, L_0(z^{-1}) = \frac{b_0}{1 + a_1 z^{-1}}$$

$$\text{Stage 1 to } L: BPF, L_1(z^{-1}) = \frac{b_{10} + b_{11} z^{-1}}{1 + a_1 z^{-1}}$$

$$a_1 = -e^{-1/\tau F_s}, b_{00} = \sqrt{1 - a_1^2}, b_{10} = -a_1^*, b_{11} = 1$$

The $a_1$ is a filter coefficient, $F_s$ is the sampling rate (e.g., in the 100 MHz range), and $\tau$ is a time constant (e.g., microseconds, milliseconds) of the charge trap effect. The time constant can be determined by looking at the charge trap effect of the power amplifier. Then, the $a_1$ filter coefficient can be determined.

In some embodiments, the outputs of the 1 to N plurality of non-linear filters 256A, 256B, 256N are summed via an adder 258 to generate a low frequency gain term $g_{lag}$. The low frequency gain term $g_{lag}$ represents the narrowband frequency correction gain.

In some embodiments, the low frequency gain term $g_{lag}$ is multiplied by the complex baseband signal input via the multiplier 260 to generate a correction signal to correct for the charge trapping effect $u_{lag}$.

In some embodiments, the first non-linear network and/or the second non-linear network is at least partially implemented in software (e.g., implemented by the digital signal processor as an all digital solution). In some embodiments, the first non-linear network and/or the second non-linear network is at least partially implemented in firmware.

Figure 3:
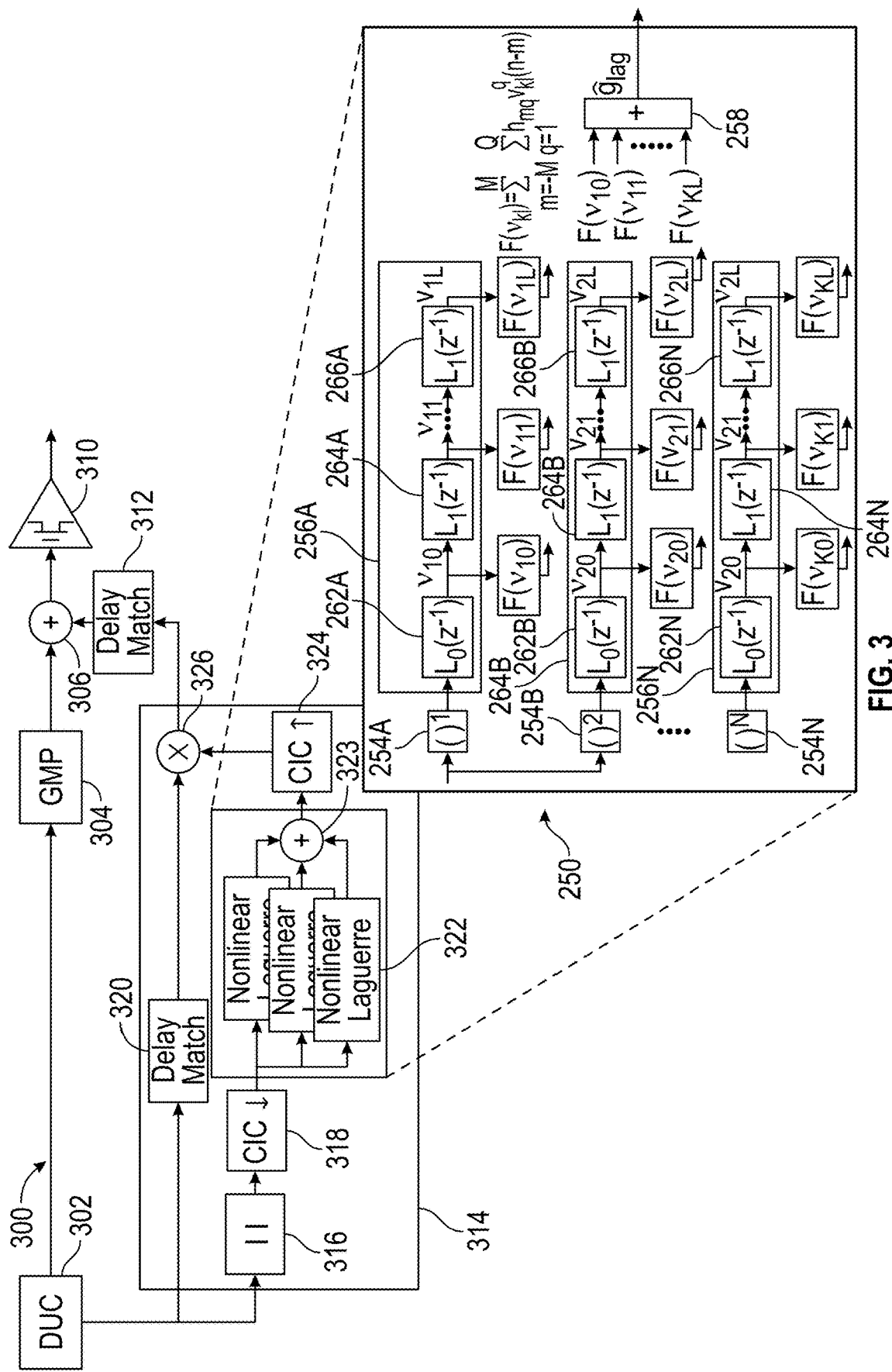
FIG. 3 illustrates an example architecture of a first non-linear filter network that includes decimation and upsampling functionality, according to some embodiments.

Example Architecture of First Non-Linear Filter Network with Decimation and Upsampling FIG. 3 illustrates an architecture of a first non-linear filter network that includes decimation and upsampling functionality, according to some embodiments. The decimation enables the processing of several hundreds of megahertz of data within the device circuitry. Without decimation, the processing of such data can require very expensive components and require large amounts of processing power.

In some embodiments, the digital upconverter 302 can feed a signal to a first non-linear filter network 314. The first non-linear filter network 314 can include an absolute value block 316 and a decimator, such as a cascade integrator comb (CIC) filter 318. The signal from the digital upconverter 302 can be processed by the absolute value block 316. The CIC filter 318 can decimate the output of the absolute value block 316 and transmit the output to the 1 to N non-linear filters 322, such as the 1 to N Laguerre filters. The decimation enables the architecture to reduce the data rate, such as by an order of 100, in order to create an efficient and practical architecture in the actuator.

In some embodiments, the output of the 1 to N non-linear filters 322 can be summed by the adder 258 to generate the low frequency gain term $g_{lag}$. The low frequency gain term can be upsampled via an upsampler 324, such as a CIC filter, to interpolate the signal back to its original sample frequency. The delay match 320 can match the signal from the output of the digital upconverter 302 to the output of the upconverter 324, and the output of the delay match 320 (which is the complex baseband input time matched with the output of the first non-linear filter network) can be multiplied to the output of the upconverter 302 via the multiplier 312. The delay match blocks (e.g., delay match 320) are to compensate for delays as data is processed through various blocks, such as the CIC filters.

In some embodiments, the digital upconverter 302 can also feed a signal to a second non-linear filter network 304. The output of the second non-linear filter network 314 can be delay matched with the output of the first non-linear filter network 304 via a delay match 312. The output of the delay match 312 can be added via the adder 306 to the output of the second non-linear filter network 304, and the output of the adder 306 can be inputted into the power amplifier 310.

Figure 4:
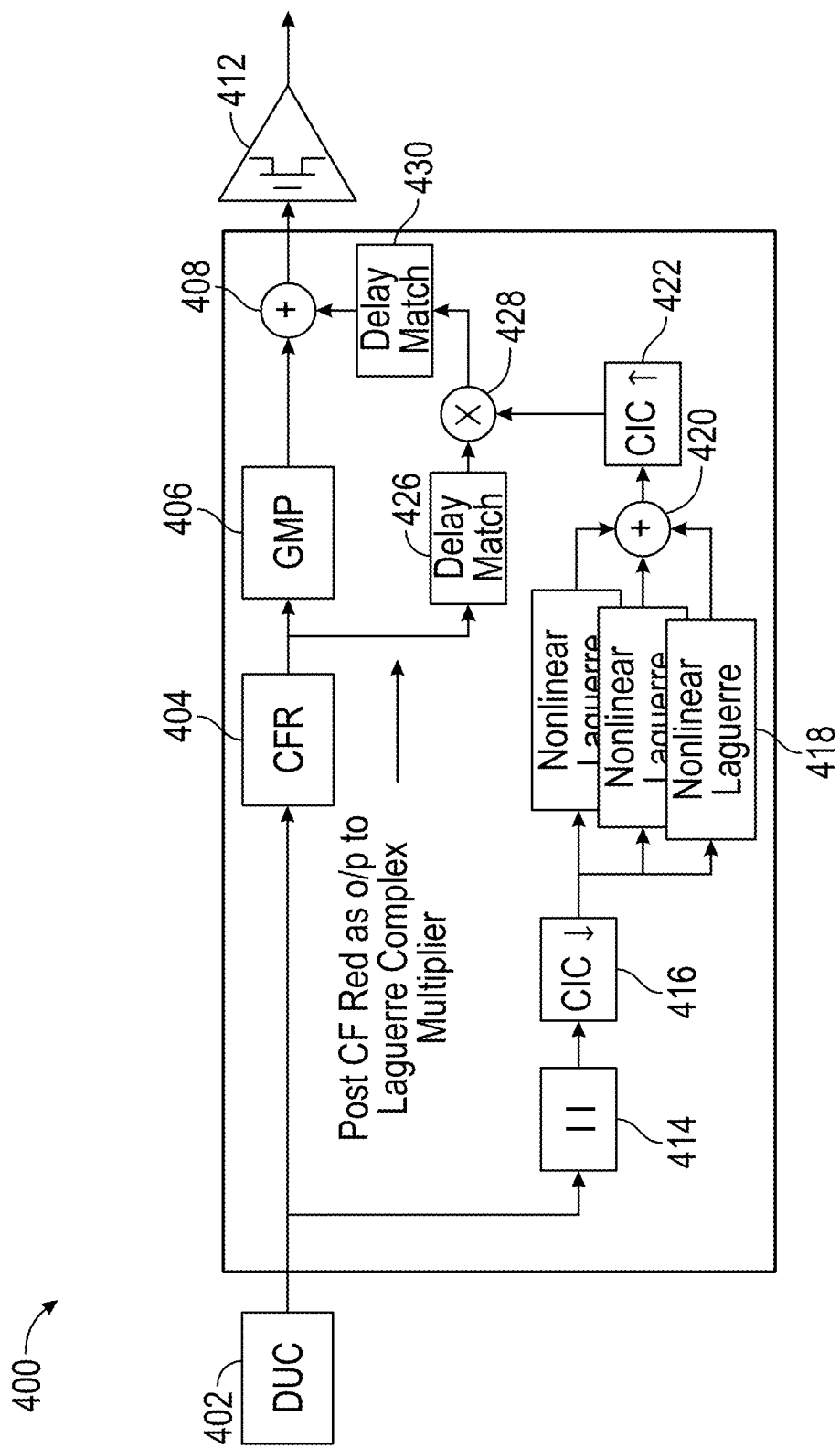
FIG. 4 illustrates an example architecture of a first non-linear filter network including a crest factor reduction function and a delay matching function, according to some embodiments.

Example Architecture of First Non-Linear Filter Network including a Crest Factor Reduction Function FIG. 4 illustrates an example architecture of a first non-linear filter network including a crest factor reduction function, a first delay block, and second delay block, according to some embodiments. 4G/5G transmitters typically use crest factor reduction (CFR) functions. The 4G/5G transmitters can be included in user devices, such as mobile devices. The 4G/5G transmitters can be included in base stations. The CFR functions can include removing peaks from the envelope of the input signal to avoid or mitigate saturation in the power amplifier. However, CFR functions result in long latency as the signal takes a lot of time to propagate through the CFR functions. Moreover the decimators and upsamplers (for example, CIC) also have delays, which collectively can result in sizable delays. However if the signal were to be delayed by the CFR function and the decimators/upsamplers, the total latency of the transmitter may be too large. To obviate or mitigate this issue, some embodiments include transmitting the output of the digital upconverter directly to the components associated with the first non-linear filter network and to process the second non-linear filter network with the output of the CFR function.

In some embodiments, the output of the Digital Upconverter (DUC) 402 can be processed by the absolute value block 414. The absolute value block 414 outputs an envelope of the signal to a downconverter (e.g., CIC filter 416). The output of the CIC filter 416 is processed through non-linear Laguerre filters and summed by the adder 420. The output of the adder 420 is processed through the upconverter (e.g., CIC filter 422) to match the frequency of the signal provided by the DUC 402. In alternative embodiments, the output of the Digital Upconverter (DUC) 402 can be processed by the CFR function 404, and the output of the CFR function 404 can be inputted to the absolute value block 414.

In some embodiments, the output of the DUC 402 is processed through a CFR function 404. The output of the CFR function 404 can be sent to a first delay match block 426 that delays the output of the CFR function 404 to match the output of the upsampler, CIC 422. Then, the multiplier can multiply the output of the CFR function 404 with the output of the CIC filter 422.

In some embodiments, the output of the CFR function 303 can also be sent to a second non-linear filter network 406, such as a GMP filter. In some embodiments, a second delay block 430 delays the output of the multiplier 428 to match the output of the second non-linear filter network 406, such as a GMP filter. Then, the output of the second delay block 430 can be added to the output of the second non-linear filter network 406 by the adder 408. Then, the output of the adder 408 can be sent to the power amplifier 412.

Figure 5:
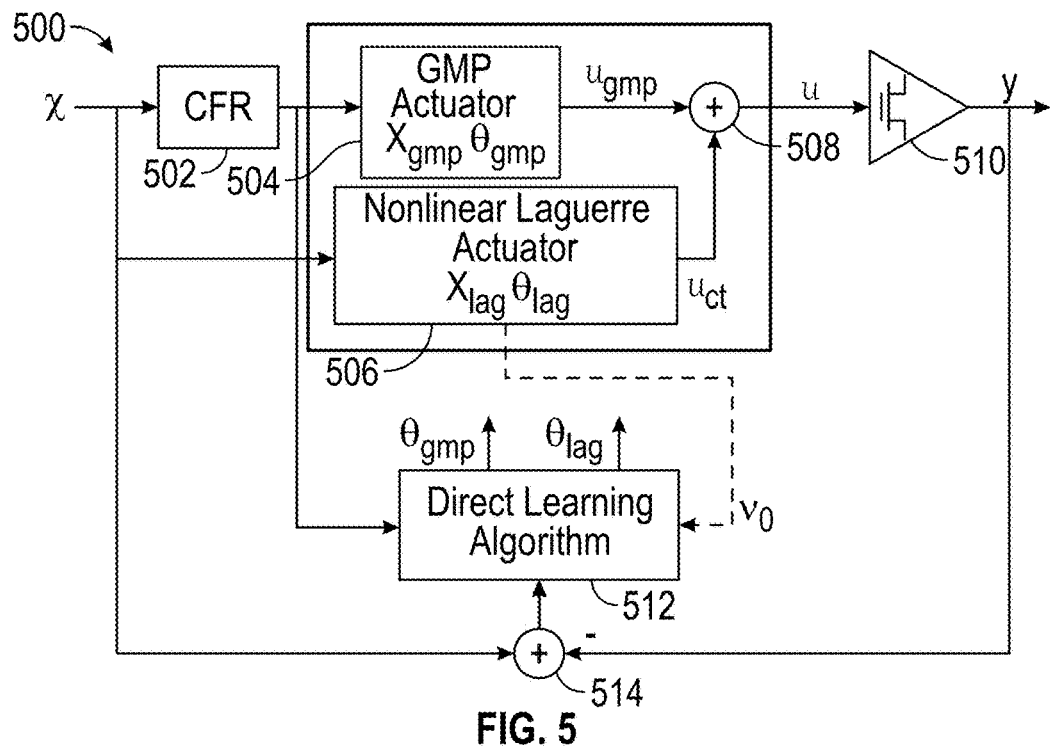
FIG. 5 illustrates an example architecture of an RF semiconductor device for training both first and second non-linear filter networks via a direct learning algorithm, according to some embodiments.

In some embodiments, delay blocks, such as the first and/or second delay blocks 426, 430, include one or more shift registers. The shift registers can be connected in series. Example Architecture for Training the First and Second Non-linear Filter Networks Via a Direct Learning Algorithm FIG. 5 illustrates an example architecture of an RF semiconductor device for training both first and second non-linear filter networks via a direct learning algorithm, according to some embodiments. The RF semiconductor device compares the observed output y of the power amplifier with the actual input signal x in order to generate an error signal. As such, the direct learning algorithm can train the GMP actuator and subsequently train the Laquerre actuator using the input, x, and the output of the power amplifier 510, y. In alternative embodiments, an indirect learning algorithm can be used to train the GMP and Laquerre actuators, such as by using the difference between the input of the power amplifier 510, u (which is a combined signal of the GMP actuator 504 and the nonlinear Laguerre Actuator 506 via the adder 508), and the same DPD (GMP and Laguerre) function applied to the output of the power amplifier 510, y.

In some embodiments, an adder 514 outputs a difference between the input x to the system and the output y of the power amplifier. The difference is sent to a direct learning algorithm 512 that determines an error signal from the difference value. Then, the system can train the GMP actuator 504 and the Laguerre actuator 506 separately. The system can process the input signal x and collect data, such as the output of the CFR block 502 and the output of the power amplifier y, to train the GMP actuator 504. Then the system can switch state machines to set up the system of equations for training the Laguerre actuator 506.

Figure 6:
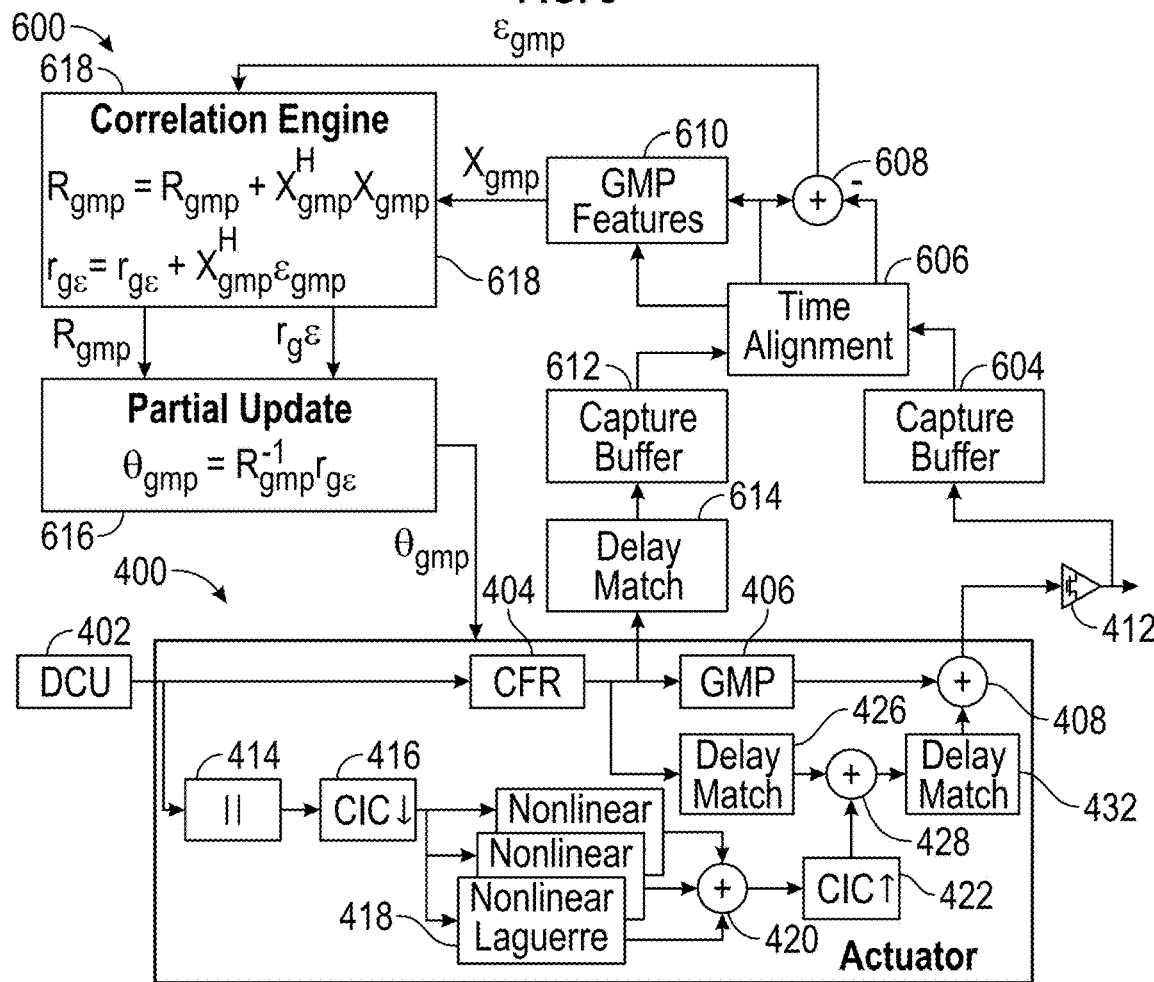
FIG. 6 illustrates an example architecture for training a generalized memory polynomial (GMP) actuator, according to some embodiments.
Figure 7:
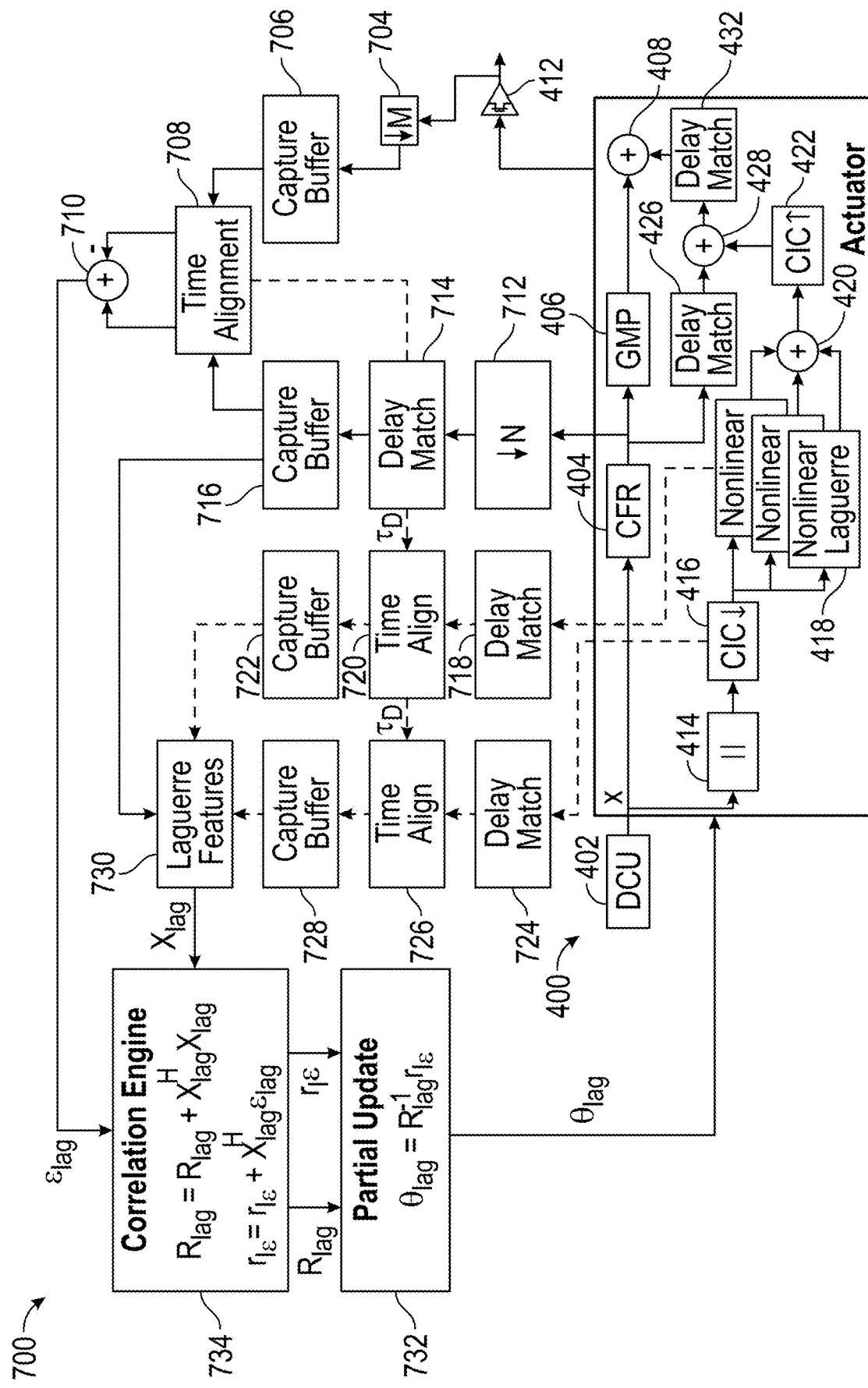
FIG. 7 illustrates an example architecture for training a Laguerre actuator, according to some embodiments.

FIG. 6 illustrates an example architecture for training a GMP actuator, according to some embodiments. FIG. 7 illustrates an example architecture for training a Laguerre actuator, according to some embodiments.

As illustrated in FIGS. 6 and 7, an RF semiconductor device can train both the GMP actuator and Laguerre actuator. The RF semiconductor device can perform a partial update on the GMP actuator (such as by using the architecture of FIG. 6), subsequently perform a partial update on the Laguerre actuator (such as by using the architecture of FIG. 7), and thereafter repeat the partial updates of the GMP and Laguerre actuators. Moreover, in the case of training the Laguerre actuator, the RF semiconductor device can down sample the training vectors, which allow the use of a shallow training buffer to capture the training vectors as well as capture data across an extended horizon. For example, a shallow training buffer of 4 k can be sampled at a 500 MHz sampling frequency, which then provides 8 us of effective buffer depth.

The signal from the digital upconverter 402 can be processed by the CFR function 404, the output of the CFR function 404 can be processed by the second non-linear filter network 406, and the output of the adder 408 can be inputted into the power amplifier 412.

In FIG. 6, the output of the CFR function 404 and the output of the power amplifier 412 is taken to train the GMP actuator. The output of the CFR function 404 is processed through a delay match block 614 to match the delay between the output of the CFR function 404 and the output of the power amplifier 412. Both the output of the delay match block 614 and the output of the power amplifier 412 fills a corresponding capture buffer 612, 604, respectively. A time alignment block 606 aligns the output of the capture buffers 612, 604. Such time alignment can aid in compensating for rate differences between samples captured at the output of the power amplifier 412 (at RF frequency) and samples captured at the output of the CFR 404 (at baseband frequency). In some embodiments, the delay match block 614 can align the output within a certain window of accuracy. The delay match block 614 can be a preconfigured delay. The time alignment block 606 can further delay the signal by tracking temporal variations in the delay, such as the delay through analog circuitry varying based on processes, supply, temperature, and/or aging. The time alignment block 606 can be dynamic, adjusting based on the tracking of temporal variations.

The system builds a matrix $X_{gmp}$ of GMP features 610, which can include linear and nonlinear terms. The GMP features are sent to the correlation engine 618 to process the GMP features. The correlation engine 618 can determine a cross-correlation vector $r_g\varepsilon$ between the features $X_{gmp}$ and the error vector $\varepsilon_{gmp}$ and the auto-correlation matrix $R_{gmp}$ to apply to a partial update block 616 which can include a solver, such as a least squares solver. The partial update block 616 can update the actuator, and the training can repeat again and/or proceed with training the Laguerre actuator.

In some embodiments, the system can cycle the process a plurality of times. The system can capture another buffer of output data from the CFR function 404 and output data from the power amplifier 412, generate GMP features, determine an error, and generate another cross-correlation vector which can be added to a previous sum of correction.

In FIG. 7, the output of the CFR function 404 and the output of the power amplifier 412 is used to train the Laguerre actuator. The output of the CIC downsampler 416 (which can include the envelope of the input signal decimated down to a lower sampling rate) can be used in the Laguerre actuator training. This output can be delayed by a delay match block 724, and a time align block 726 can time align the output of the delay match block 724 to match with the time alignment set of the time alignment block 708. The time aligned signal is sent to a capture buffer 728, and then the signal is sent to a Laguerre Features block 730 to generate Laguerre features. The capture buffers can be on the order of approximately 5, 10, 50, 100, 500 samples long. Because the signal has been downsampled at the output of the CIC downsampler 416, the signals captured at the capture buffer captures data long enough in time to obtain samples through the charging and/or discharging profile. As discussed herein, the time constant effect of charging and discharging, such as in FIG. 1C, include narrowband distortion over a longer period of time than typical digital predistortion.

In some embodiments, the Laguerre features 730 are sent to a correlation engine 734 to process GMP features to determine the cross-correlation vector $r_l\varepsilon$ and the auto-correlation matrix $R_{lag}$, and a partial update module 732 such as a least squares solver. The Laguerre features 730, correlation engine 734, and/or the partial update module 732 can be implemented in software, firmware, and/or a combination.

In some embodiments, an initial condition (e.g., $v_o$) of the non-linear Laguerre filters 418 is used to train the Laguerre actuator. The initial condition is to prevent a transient effect in the system of equations that can affect other variables and equations that would result in incorrect outcomes and solutions. In some embodiments, the initial states or conditions can be predetermined. Such an approach may work for systems that have one or two stages of cascade Laguerre filters. However if the system has three, four, five, or more cascade Laguerre filters, the system of equations becomes complex and the charge trap correction becomes more and more incorrect with assumed initial conditions.

In order to mitigate or obviate the deficiencies noted above, some embodiments disclose taking actual initial condition readings from the Laguerre filter actuator. The initial conditions from the non-linear Laguerre filters 418 are delayed by a delay match block 718, and a time align block 720 can time align the output of the delay match block 718. A capture buffer 722 can capture samples of the initial condition, and the initial conditions can be sent to the Laguerre features block 730 to generate Laguerre features based on the generating of matrices of Laguerre terms. The initial conditions and initial state of the non-linear Laguerre filters 418 are further described in reference with FIG. 8.

In some embodiments, the difference between the output of the CFR function 404 and the power amplifier 412 is used to train the Laguerre actuator. Similar to the embodiment of FIG. 6, the output of the CFR function 404 is delay matched 714 and stored in a capture buffer 716. The output of the power amplifier 412 is also stored in a capture buffer 706. The output of the capture buffers 706, 716 are time aligned 708, and the difference via an adder 710 is sent to the correlation engine 734 to determine the cross-correlation vector $r_l\varepsilon$ and the auto-correlation matrix $R_{lag}$.

In some embodiments, the output of the CFR function 404 is downsampled by N via a downsampler 712. The downsampler 712 can downsample the output of the CFR function 404 to match the decimated rate of the envelope (e.g., the output of block 416). For example, the down sampler can take one input from every 100 samples. In some embodiments, the output of the power amplifier 412 is downsampled by M via a downsampler 704. The downsampler 704 can downsample the output of the power amplifier 412 to match the decimated rate of the envelope (e.g., the output of block 416). Thus, the inputs to the two capture buffers 716 and 706 can be at matching sampling rates. In some embodiments, a downsampler is used instead of a decimation filter, because the downsampled signal is used to fit a model in the correlation engine 734 (not to reconstruct the signal). Advantageously, the capture buffer can see data over a much longer period of time. For example, if the capture buffers can only capture 10,000 samples long but the down sampling is by a factor of 100, now the capture buffer can extend the 10,000 samples over 100 times. So if the capture buffer alone could only see 1 microseconds of data, the capture buffer with the downsampling can now save data over 10 millisecond. Such downsampling enables the system to capture narrowband, slower transient effects.

In some embodiments, the training for the GMP actuator (e.g., FIG. 6) and the training for the Laguerre actuator (e.g., FIG. 7) occur in series and/or do not occur concurrently. Thus, the capture buffers can be reused. For example, the system can power on the power amplifier and other hardware, capture data and train the GMP actuator, capture data and train the Laguerre actuator, and repeat both training. Advantageously because of reuse of certain components, the system can be smaller and use less components.

Identifying Initial Conditions for Laguerre Actuator Training

Figure 8:
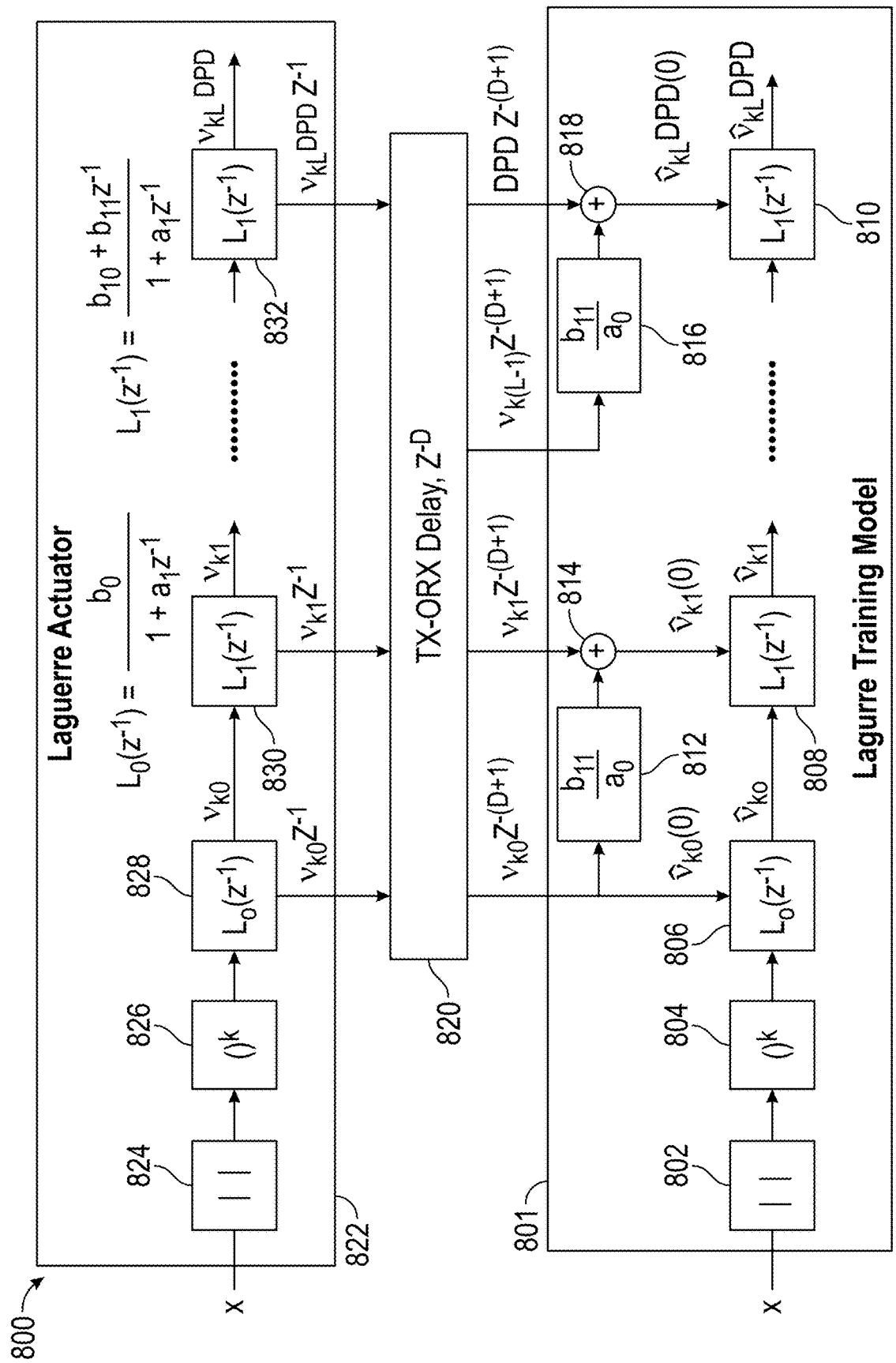
FIG. 8 illustrates an example architecture for identifying initial conditions for the Laguerre actuator training, according to some embodiments.

FIG. 8 illustrates an example architecture for identifying initial conditions for the Laguerre actuator training, according to some embodiments. The Laguerre actuator 822 receives the signal, generates an envelope of the signal via the absolute value block 824, applies non-linear correction via a corrective element 826 (e.g., by applying a power to the signal such as the signal squared or cubed), and passes the signal through the Laguerre filters 828, 830, 832. One or more Laguerre filters can include an autoregressive term, where the output of each of the filters are delayed via the TX-ORX Delay 820 and fed into the Laguerre training model 801 in a feedback loop. The term that is fed is the initial phase that is used in the Laguerre training model 801. The Laguerre training model then receives a signal and again, generates an envelope of the signal via the absolute value block 802, applies non-linear correction via a corrective element 804 (e.g., by applying a power to the signal such as the signal squared or cubed), and passes the signal through the Laguerre filters 806, 808, 810. However, the Laguerre filters 806, 808, 810 of the Laguerre training model 801 receive the initial conditions where the initial conditions are weighted via the equations 812, 816 and adders 814, 818. $v_{kl}$ DPD is the actuator internal state. $\hat{v}_{kl}$ DPD is the training model internal state. $v_{kl}(n-D)=v_{kl}z^{-D}$ is the previous internal state of Laguerre Filter. $z^{-D}$ is the time delay. Stage 0 of the Laguerre actuator is initialized to $\hat{v}_{k0}(0)=-a_1 v_{k0}(n-1)z^{-D}$ and the remaining stages are initialized to $\hat{v}_{kl}(0)=-a_1 v_{kl}(n-1)z^{-D}+b_{11}v_{k(l-1)}(n-1)z^{-D}$. The term $\hat{v}$ is used to generate the Laguerre features, as described herein such as with relation to FIG. 7.

Training Both GMP and Laguerre Actuators Simultaneously

Figure 9:
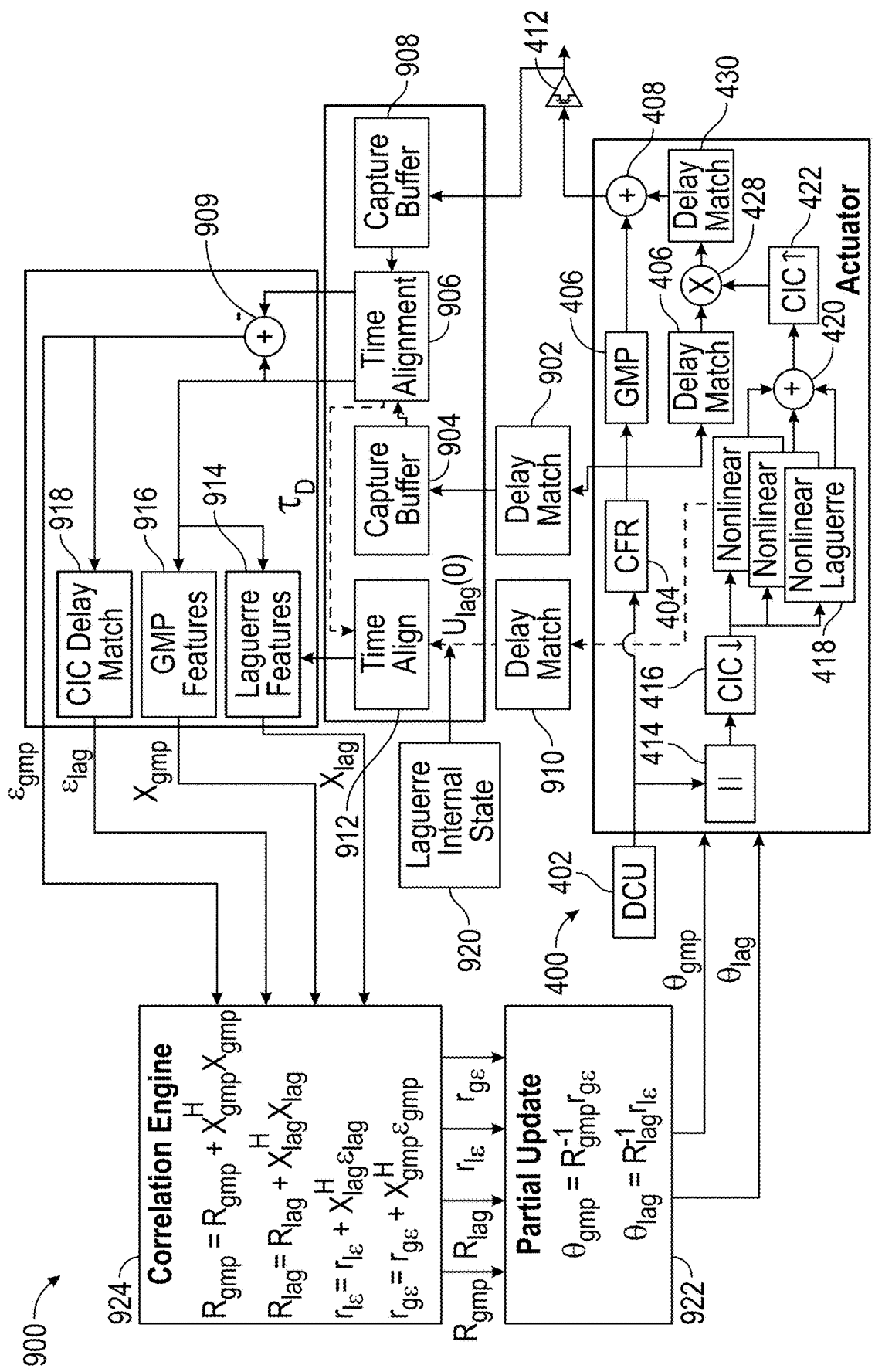
FIG. 9 illustrates an example architecture for an RF semiconductor device to train both the GMP and Laguerre actuator simultaneously, according to some embodiments.

FIG. 9 illustrates an example architecture for an RF semiconductor device to train both the GMP and Laguerre actuators simultaneously, according to some embodiments. In some embodiments, the RF semiconductor device can train the Laguerre actuator without downsampling using this architecture. The RF semiconductor device can capture data from the Laguerre actuator over a long period of time. The capture buffers would capture more data for a longer period of time than the buffers of the prior figures. For example, the RF semiconductor device can capture data in hundreds of megahertz, which can fill the buffers and train over a window of data of tens of microseconds. Then, the RF semiconductor device can retrain the Laguerre actuator again and again, effectively scanning over a window of data of milliseconds. In some embodiments, the sampling frequency can be between 10-500 MHz. In some embodiments, the Laguerre actuator can be trained over a window of time between 100 nanoseconds to 1 millisecond, 1 millisecond to 10 milliseconds, and/or the like.

The output of the non-linear Laguerre filters 418, the CFR function 404, and the output of the power amplifier 412 are taken, and aligned by the delay match blocks 910, 902 and the time alignment blocks 912, 906. The capture buffers 904, 908 capture the data. A difference between the output of the CFR function 404 and the output of the power amplifier 412 is determined via the adder 909. The difference signal from the adder 909 is sent to the GMP features generator 916, the Laguerre features generator 914, and the CIC delay match block 918. The Laguerre features generator 914 also receives the initial conditions from the time alignment block 912. The GMP features generator 916 and the Laguerre features generator 914 generate the corresponding polynomials and send the polynomials to the correlation engine 924. The correlation engine 618 can determine a cross-correlation vector $r_g\varepsilon$ and the auto-correlation matrix $R_{gmp}$ for the GMP actuator, and the cross-correlation vector $r_l\varepsilon$ and the auto-correlation matrix $R_{lag}$ for the Laguerre actuator. The Laguerre Internal State 920 is the initialization function explained above with relation to FIG. 8, where the internal state of the actuator is identified and converted to the initial state of the Laguerre adaptation.

Using Two Non-Linear Filter Networks to Correct Low and Broadband Distortion

Figure 10:
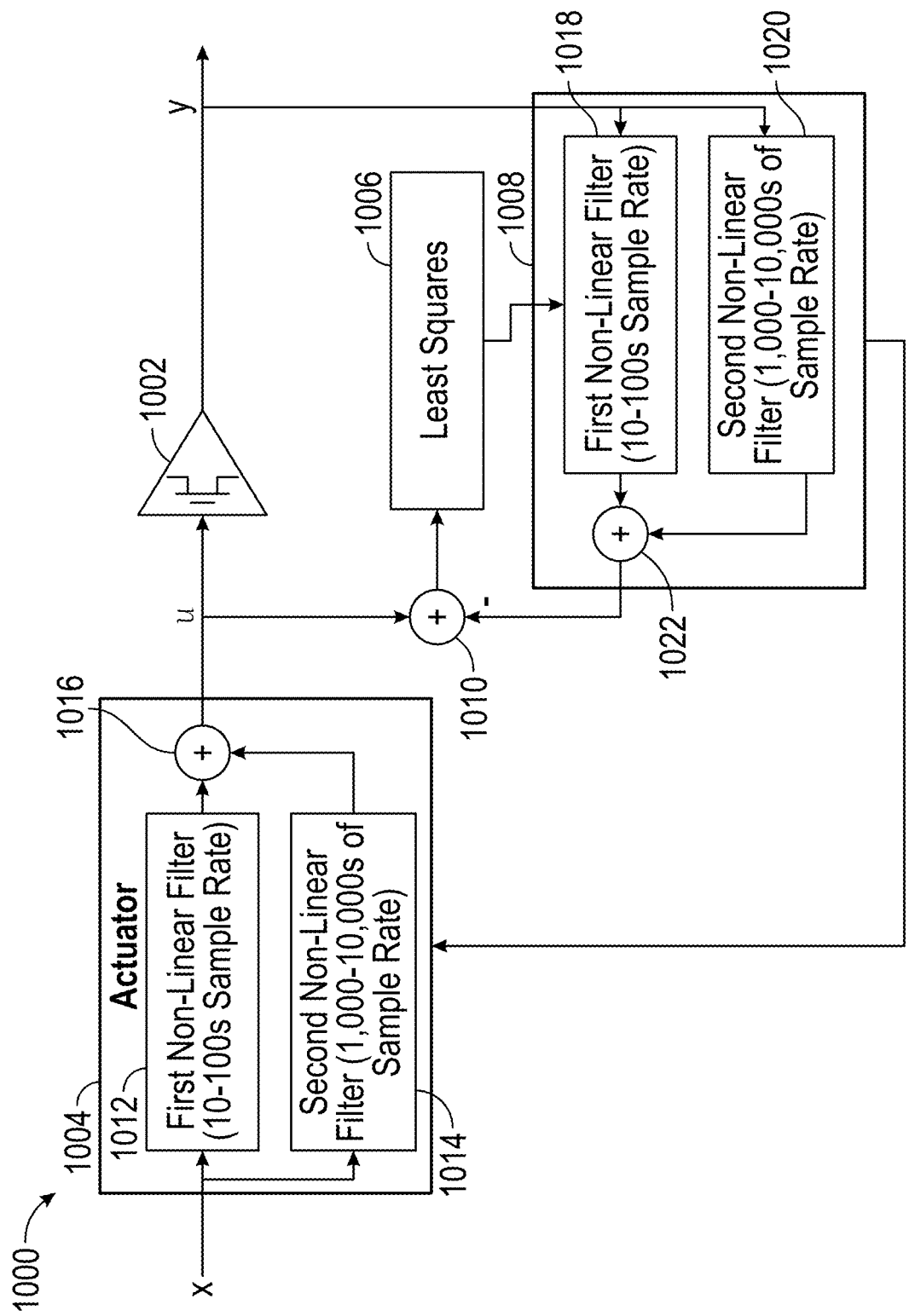
FIG. 10 illustrates an RF semiconductor device including a first non-linear filter network comprising FIR filters to correct narrowband distortion and a second non-linear filter network comprising FIR filters to correct broadband distortion, according to some embodiments.

FIG. 10 illustrates an RF semiconductor device including a first non-linear filter network comprising FIR filters to correct narrowband distortion and a second non-linear filter network comprising FIR filters to correct broadband distortion, according to some embodiments. The first non-linear filter network 1012 can include a first non-linear actuator and the second non-linear filter can include a second non-linear actuator 1014. The first non-linear filter network 1012 can be in parallel with the second non-linear filter network 1014. The first non-linear filter network 1012 can include a GMP actuator, a Laguerre actuator, and/or the like. The second non-linear filter network 1014 can include a GMP actuator, a Laguerre actuator, and/or the like. The output of the first non-linear filter network 1012 and the second non-linear filter network 1014 can be added by the adder 1016 and the combined signal can be sent to the power amplifier 1002.

In some embodiments, the device can further comprise a feedback actuator 1008 that also includes a first non-linear filter network 1018 that is parallel with a second non-linear filter network 1020. The feedback actuator 1008 can receive the input and output of the power amplifier 1002, used to fit an inverse model. The output of the power amplifier 1002 can be fed into another first non-linear filter network 1018 and another second first non-linear filter network 1020. The output of the other first non-linear filter network 1018 and other second non-linear filter network 1020 are added by the adder 1022. Then, the input of the power amplifier 1002 is subtracted by the output of the adder 1022 via another adder 1010. The output of the adder 1010 is processed through a least squares module 1006. The output of the least squares module 1006 is used by the other second non-linear filter network 1018. The system can use other solvers other than the least squares module 1006.

In some embodiments, the first non-linear filter network 1012 can have a certain sample rate to correct for narrowband distortion by capturing samples over longer time constraints. The second non-linear filter network 1014 can have to have a higher sampling rate to correct for higher frequency noise.

Example Embodiments Compensating for Power Amplifier Ramp-Up

A power amplifier can exhibit different performance characteristics shortly after the time of being powered up (for instance, just after being enabled) relative to steady-state operation after the power amplifier has settled. Such power amplifier effects can arise from a variety of factors, such as power amplifier self-heating. For example, the initial operation of a power amplifier when cool can vary relative to operation of the power amplifier after it has reached a steady state operating temperature.

In certain applications, a power amplifier is turned on for a long period of time, and then turned off for a long period of time. For example, for a base station or mobile device using time-division duplexing (TDD), the power amplifier can be turned on for a transmit time slot, and turned off for a receive time slot.

The DPD systems herein can be implemented to compensate for the transient changes to a power amplifier's performance after turn-on versus steady-state. For example, any of the embodiments herein can be used to store multiple sets of coefficients for DPD (including coefficients used for charge trapping DPD). Additionally, the DPD system can be configured to use one set of coefficients shortly after turn on of a power amplifier (for instance, for a time period T after power amplifier turn-on), and a second set of coefficients in the steady state (for example, after period T).

By using two (or more) sets of coefficients for DPD, a power amplifier can be more effectively linearized including both for initial or start-up operation and for steady-state operation.

Any of the embodiments herein can be implemented with multiple sets of DPD coefficients that are selectively used (and trained) depending on how long a power amplifier has been turned on/enabled.

Additional Embodiments

In the foregoing, it will be appreciated that any feature of any one of the embodiments can be combined or substituted with any other feature of any other one of the embodiments.

Aspects of this disclosure can be implemented in various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A radio frequency (RF) power semiconductor device, wherein the device comprises:
   a first non-linear filter network configured to compensate for narrowband distortion of a power amplifier, wherein the first non-linear filter network comprises a corrective element configured to correct for a non-linear portion of the power amplifier, wherein the first non-linear filter network comprises:
      a first plurality of infinite impulse response (IIR) filters arranged in series and configured to generate first cancellation terms for the power amplifier at a first time scale, and
      a second plurality of IIR filters arranged in series and configured to generate second cancellation terms for the power amplifier at a second time scale; and
   a second non-linear filter network configured to compensate for broadband distortion of the power amplifier.

2. The device of claim 1, wherein a first filter of the first plurality of IIR filters comprises a low pass filter (LPF).

3. The device of claim 2, wherein a second filter of the first plurality of IIR filters comprises an all-pass filter.

4. The device of claim 1, wherein the first plurality of IIR filters are orthogonal to each other.

5. The device of claim 1, wherein the first and second plurality of IIR filters are arranged in parallel.

6. The device of claim 5, further comprising corrective elements corresponding to the first plurality of IIR filters and the second plurality of IIR filters, wherein the corrective elements correct for the non-linear portion of the power amplifier to generate a corrected signal before the corrected signal propagates through the corresponding IIR filters.

7. The device of claim 6, wherein correcting for the non-linear portion of the power amplifier comprises, for each of the corrective elements, applying an exponential to the amplitude of a signal outputted by the power amplifier.

8. The device of claim 1, wherein the device further comprises:
   the power amplifier, wherein the power amplifier comprises a compound semiconductor power amplifier, and the narrowband distortion is caused by charge trapping effects as the compound semiconductor power amplifier is charged from low to high power.

9. The device of claim 8, wherein the compound semiconductor power amplifier comprises a Gallium Nitride (GaN) power amplifier.

10. The device of claim 1, further comprising:
    a down sampler to down sample an input signal and transmit the down sampled signal to the first non-linear filter network; and
    an up sampler to up sample an output of the first non-linear filter network.

11. The device of claim 1, further comprising:
    a mixer to mix an output of the first non-linear filter network with an input of the first non-linear filter network; and
    a first buffer configured to delay the input of the first non-linear filter network to match the timing of the input with the output of the first non-linear filter network.

12. The device of claim 11, wherein the second non-linear filter network comprises a plurality of finite impulse response (FIR) filters, the device further comprising: a second buffer configured to delay the output of the mixer with the output to match the timing with the output of the FIR filters.

13. The device of claim 1, wherein the second non-linear filter network comprises a plurality of finite impulse response (FIR) filters.

14. The device of claim 1, wherein the first non-linear filter network comprises a Laguerre filter.

15. The device of claim 1, wherein the first plurality of IIR filters and the second plurality of IIR filters are arranged in parallel with one another.

16. A radio frequency (RF) power semiconductor device, wherein the device comprises:
    a first non-linear filter network configured to compensate for narrowband distortion of a power amplifier, wherein the first non-linear filter network comprises a first plurality of infinite impulse response (IIR) filters arranged in series and configured to correct for a non-linear portion of the power amplifier over a first time scale, and a second plurality of IIR filters arranged in series and configured to correct for the non-linear portion of the power amplifier over a second time scale,
    mixer configured to mix an output of the first non-linear filter network with an input of the first non-linear filter network; and
    a first buffer configured to delay the input of the first non-linear filter network to match the timing of the input with the output of the first non-linear filter network.

17. The device of claim 16, wherein the first plurality of IIR filters comprise Laguerre filters.

18. The device of claim 16, wherein the device further comprises:
    a crest factor reduction function; and
    a second non-linear filter network configured to compensate for broadband distortion of the power amplifier,
    wherein the crest factor reduction function is connected in series with the second non-linear filter network.

19. The device of claim 18, wherein the second non-linear filter network comprises a plurality of finite impulse response (FIR) filters.

20. A method of digital predistortion (DPD) comprising:
    amplifying a transmit signal using a power amplifier;

compensating for narrowband distortion of the power amplifier by pre-distorting the transmit signal using a first non-linear filter network, including correcting for a non-linear portion of the power amplifier using a corrective element of the first non-linear filter network, wherein the first non-linear filter network further includes a group of infinite impulse response (IIR) filters, wherein each group of IIR filters has a plurality of IIR filters arranged in series, wherein the groups of IIR filters are arranged in parallel; and compensating for broadband distortion of the power amplifier by pre-distorting the transmit signal using a second non-linear filter network.

* * * * *